US00RE41842E

(19) United States
(12) Reissued Patent
Jeong

(10) Patent Number: US RE41,842 E
(45) Date of Reissued Patent: Oct. 19, 2010

(54) METHODS OF FORMING ELECTRICAL INTERCONNECTS ON INTEGRATED CIRCUIT SUBSTRATES USING SELECTIVE SLURRIES

(75) Inventor: In-Kwon Jeong, Seongnam (KR)

(73) Assignee: Samsung Electronics Co., Ltd., Suwon-si, Gyeonggi-do (KR)

(21) Appl. No.: 11/493,014

(22) Filed: Jul. 26, 2006

Related U.S. Patent Documents

Reissue of:
(64) Patent No.: 5,960,317
Issued: Sep. 28, 1999
Appl. No.: 08/938,737
Filed: Sep. 26, 1997

(30) Foreign Application Priority Data

Dec. 5, 1996 (KR) ..... 96-62128

(51) Int. Cl.
*H01L 21/4763* (2006.01)

(52) U.S. Cl. ..... 438/633; 438/626; 438/631; 438/691; 438/692; 438/645; 438/637; 438/627; 438/629; 257/E21.576

(58) Field of Classification Search ..... 438/691, 438/626, 631, 633, 645, 637, 692
See application file for complete search history.

(56) References Cited

U.S. PATENT DOCUMENTS 5,494,854 A 2/1996 Jain
5,578,523 A * 11/1996 Fiordalice et al. ..... 438/633

(Continued)

FOREIGN PATENT DOCUMENTS

JP 07-135252 5/1995
JP 07-142465 6/1995
JP 07-283177 10/1995
JP 08-124886 5/1996
JP 08-288391 11/1996

OTHER PUBLICATIONS

Japanese Office Action Dated Jul. 27, 2010.

*Primary Examiner*—Thanh Nguyen
(74) *Attorney, Agent, or Firm*—Volentine & Whitt, PLLC

(57) ABSTRACT

Methods of forming electrical interconnects include the steps of forming a first electrically conductive layer on a semiconductor substrate and then forming a first electrically insulating layer on the first electrically conductive layer. A second electrically insulating layer is then formed on the first electrically insulating layer. The second electrically insulating layer is then etched to expose the first electrically insulating layer and then a third electrically insulating layer is formed on the first electrically insulating layer. The first and third electrically insulating layers are then etched to define a contact hole therein which exposes a portion of the first electrically conductive layer. A barrier metal layer is then formed. The barrier metal layer is preferably formed to extend on the third electrically insulating layer and on the exposed portion of the first electrically conductive layer. The second electrically conductive layer is then formed to extend on the barrier metal layer and into the contact hole. The second electrically conductive layer and barrier metal layer are then polished in sequence to expose the third electrically insulating layer. The step of polishing the second electrically conductive layer and the barrier metal layer preferably comprises the steps of polishing the second electrically conductive layer and the third electrically insulating layer simultaneously at a first rate and a second rate less than the first rate, respectively, using a first slurry, and then polishing the second electrically conductive layer and the third electrically insulating layer simultaneously at a third rate and a fourth rate greater than the third rate, respectively, using a second slurry.

20 Claims, 8 Drawing Sheets

U.S. PATENT DOCUMENTS 5,607,880 A * 3/1997 Suzuki et al. ..... 438/624
5,663,102 A 9/1997 Park
5,783,485 A 7/1998 Ong et al.
5,786,275 A 7/1998 Kubo
5,840,625 A 11/1998 Feldner
5,858,875 A 1/1999 Chung et al.
5,880,018 A 3/1999 Boeck et al.
5,882,999 A * 3/1999 Anderson et al. ..... 438/629
5,920,790 A * 7/1999 Wetzel et al. ..... 438/618
6,100,184 A * 8/2000 Zhao et al. ..... 438/638
6,329,284 B2 * 12/2001 Maekawa ..... 438/637

* cited by examiner

METHODS OF FORMING ELECTRICAL INTERCONNECTS ON INTEGRATED CIRCUIT SUBSTRATES USING SELECTIVE SLURRIES

Matter enclosed in heavy brackets [ ] appears in the original patent but forms no part of this reissue specification; matter printed in italics indicates the additions made by reissue.

FIELD OF THE INVENTION

The present invention relates to methods of forming integrated circuits and more particularly, to methods of forming electrical interconnects on integrated circuit substrates.

BACKGROUND OF THE INVENTION

A wiring layer in a semiconductor device functions to transmit signals and is typically connected to lower conduction layers via contact plugs. Contact plugs should typically be formed of low-resistivity metals in order to prevent signal delays.

FIGS. 1A–1D are sectional views for illustrating a conventional method of forming a contact plug in a semiconductor device. In FIGS. 1A–1D, reference numeral 1 is a semiconductor substrate, reference numeral 3 is an inter-insulating layer, reference numeral 5 is a wiring layer, reference numerals 7, 7a and 7b are insulating films, reference numeral 8 is a contact hole, reference numerals 9 and 9a are barrier layers and reference numerals 11 and 11a are material layers. Referring to FIG. 1A, a conductive material is deposited on a semiconductor substrate 1 on which an inter-insulating layer 3 is formed, and then patterned to form a wiring layer 5. Next, an insulating material is deposited on the semiconductor substrate 1 on which the wiring layer 5 is formed, thereby forming the insulating film 7. The wiring layer 5 may be formed of a metal, e.g., aluminum (Al). The insulating film 7 has depressed portions which conform to the structure of the wiring layer 5.

Referring now to FIG. 1B, the insulating film 7 undergoes a chemical and mechanical polishing (CMP) process to form a planarized insulating film 7a. At this time, the insulating film 7a can be formed to a predetermined thickness by controlling the time required for the polishing process. Thereafter, a cleaning process such as a spin scrubbing method is performed to remove particles generated during the polishing process.

Referring now to FIG. 1C, the insulating film 7a is etched using photolithography to expose the surface of the wiring layer 5 and form contact holes 8. Titanium (Ti) and titanium nitride (TiN) are sequentially deposited in the contact holes 8 to form a barrier layer 9 having a titanium nitride (TiN)/titanium (Ti) structure. Then, tungsten (W) is deposited on the entire surface of the semiconductor substrate 1 on which the barrier layer 9 is formed, thereby forming the material layer 11. The titanium reduces the contact resistance between the tungsten as the component material of the material layer 11 and the aluminum as that of the wiring layer 5. The titanium nitride also improves adhesion of the tungsten.

Referring to FIG. 1D, the material layer 11 and the barrier layer 9 undergo a chemical and mechanical polishing (CMP) process until an insulating film 7b is exposed. Accordingly, a plurality of contact plugs comprised of a material layer 11a and a barrier layer 9a are formed in the contact hole 8. As described above, the CMP process is carried out two times, after the deposition of the insulating film 7 and after the deposition of the material layer 11. Unfortunately, the use of two polishing steps complicates the process for forming contact plugs.

SUMMARY OF THE INVENTION

It is therefore an object of the present invention to provide improved methods of forming electrical interconnects on integrated circuit substrates.

These and other objects, advantages and features of the present invention are provided by methods of forming electrical interconnects which include the steps of forming a first electrically conductive layer on a semiconductor substrate and then forming a first electrically insulating layer on the first electrically conductive layer. A second electrically insulating layer is then formed on the first electrically insulating layer. The second electrically insulating layer is then etched to expose the first electrically insulating layer and then a third electrically insulating layer is formed on the first electrically insulating layer. The first and third electrically insulating layers are then etched to define a contact hole therein which exposes a portion of the first electrically conductive layer. A barrier metal layer is then formed. The barrier metal layer is preferably formed to extend on the third electrically insulating layer and on the exposed portion of the first electrically conductive layer. The second electrically conductive layer is then formed to extend on the barrier metal layer and into the contact hole. The second electrically conductive layer and barrier metal layer are then polished in sequence to expose the third electrically insulating layer.

According to a preferred aspect of the present invention, the step of polishing the second electrically conductive layer and the barrier metal layer comprises the steps of polishing the second electrically conductive layer and the third electrically insulating layer simultaneously at a first rate and a second rate less than the first rate, respectively, using a first slurry, and then polishing the second electrically conductive layer and the third electrically insulating layer simultaneously at a third rate and a fourth rate greater than the third rate, respectively, using a second slurry. These polishing steps are preferably performed in an apparatus containing first and second polishing plates with the first and second slurries, respectively. According to another preferred aspect of the present invention, the step of forming a third electrically insulating layer is followed by the step of forming a trench having a first width in the third electrically insulating layer. According to this aspect of the present invention, the step of patterning the first and third electrically insulating layers comprises patterning the first and third electrically insulating layers to define a contact hole having a second width less than the first width, extending between a bottom of the trench and the first electrically conductive layer.

DESCRIPTION OF THE PREFERRED EMBODIMENTS

Figure 1A:
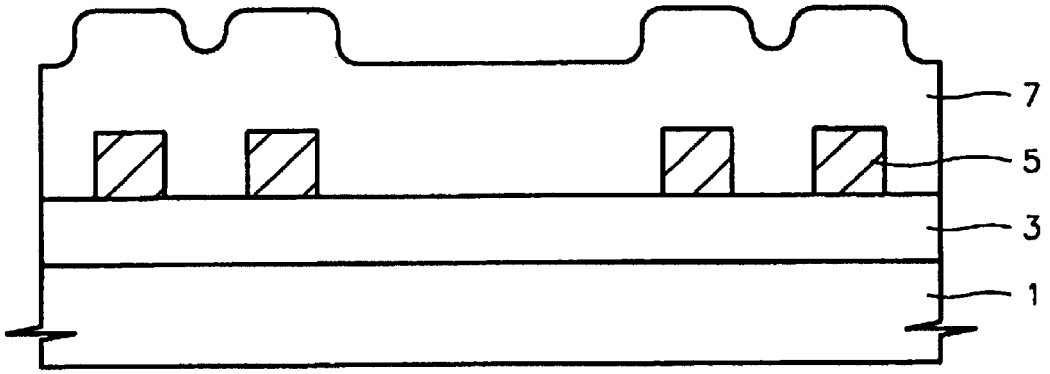
FIG. 1A (PRIOR ART)
FIGS. 1A–1D are cross-sectional views of intermediate structures that illustrate a method of forming electrical interconnects according to the prior art.
Figure 1B:
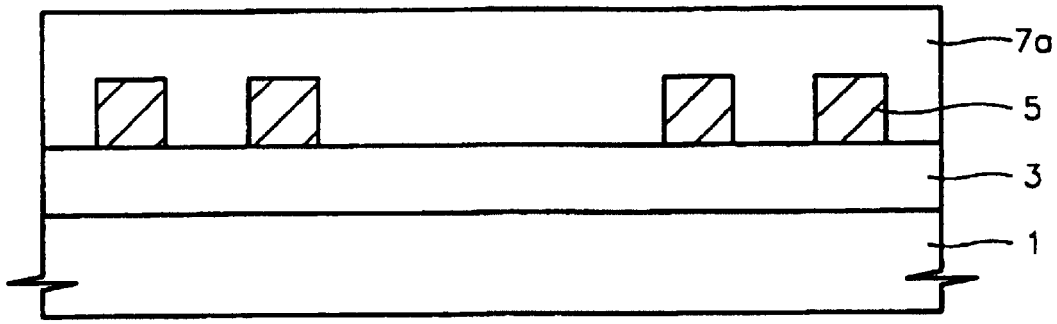
FIG. 1B (PRIOR ART)
Figure 1C:
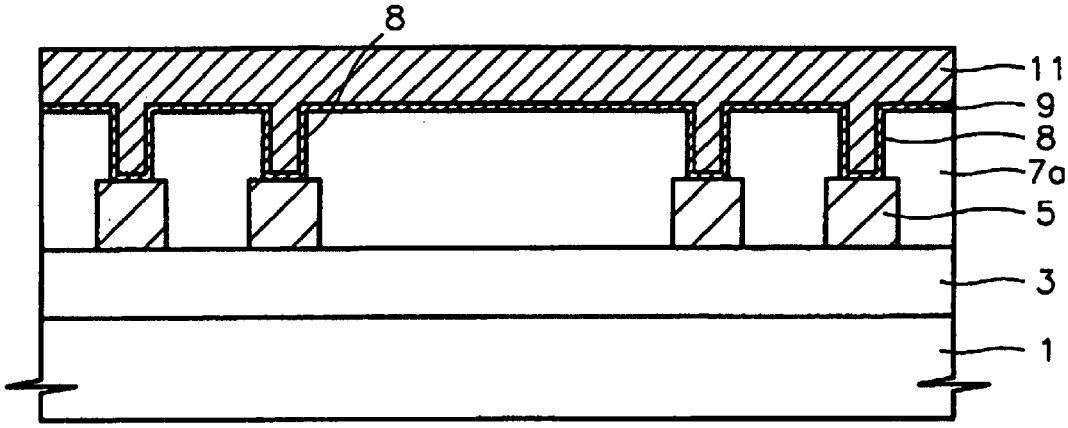
FIG. 1C (PRIOR ART)
Figure 1D:
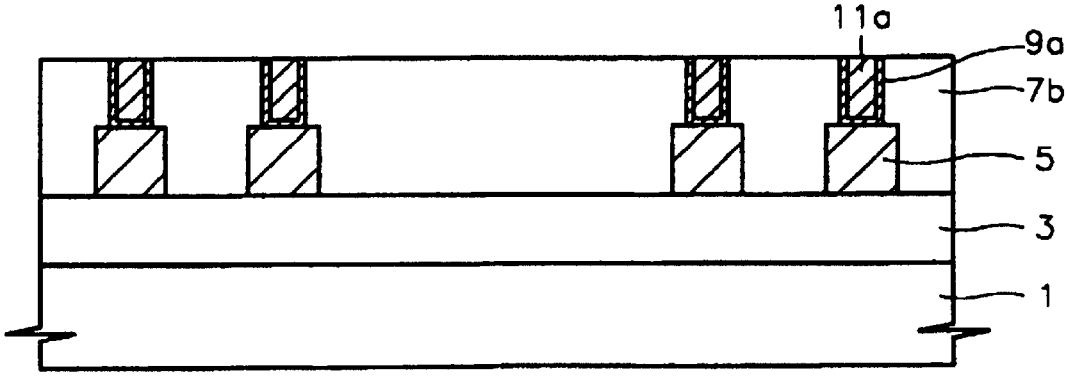
FIG. 1D (PRIOR ART)

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Referring to FIGS. 2A to 2E, reference numeral 21 is a semiconductor substrate, reference numeral 23 is an inter-insulating layer, reference numeral 25 is a wiring layer, reference numerals 27, 27a and 27b are first insulating films, reference numeral 29 is a second insulating film, reference numerals 31, 31a and 31b are third insulating films, reference numeral 32 is a contact hole, reference numerals 33, 33a and 33b are barrier layers, and reference numerals 35, 35a and 35b are material layers.

Figure 2A:
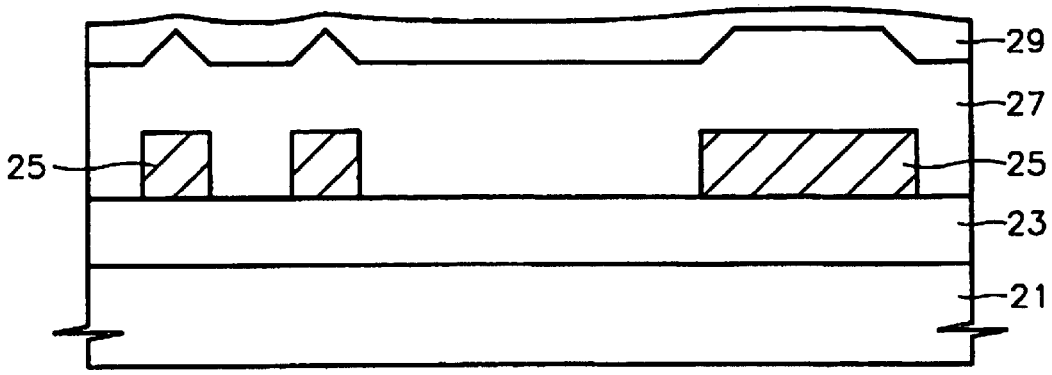
FIGS. 2A–2E are cross-sectional views of intermediate structures that illustrate a method of forming electrical interconnects according to a first embodiment of the present invention.

Referring specifically to FIG. 2A, a conductive material is deposited on the semiconductor substrate 21 on which the inter-insulating layer 23 is formed, and then patterned to form the wiring layer 25. An insulating material is deposited on the semiconductor substrate 21 on which the wiring layer 25 is formed, thereby forming the first insulating film 27. Then, the second insulating film 29 is formed on the first insulating film 27. The wiring layer 25 may be formed of a metal, e.g., aluminum (Al). The first insulating film 27 is formed by depositing an oxide material including silicon to a thickness of between 1000 and 100000 Å using a high density plasma method wherein deposition and etching are simultaneously performed. At this time, a step difference is generated due to the wiring layer 25. $SiO_2$, SiOF, boron phosphorus silicate glass (BPSG), etc. can be used as the oxide material including silicon. The second insulating film 29 may be formed by depositing silicon-on-glass (SOG) to a thickness of between 1000 and 100000 A. However, any one selected among a flowable oxide, a photoresist and an insulating polymer can be used instead of SOG. Alternatively, the second insulating film 29 can be formed by depositing any one of the above materials twice or more. At this time, a thermal treatment step is additionally performed after each of the depositing steps in order to improve the characteristics of the film material.

Figure 2B:
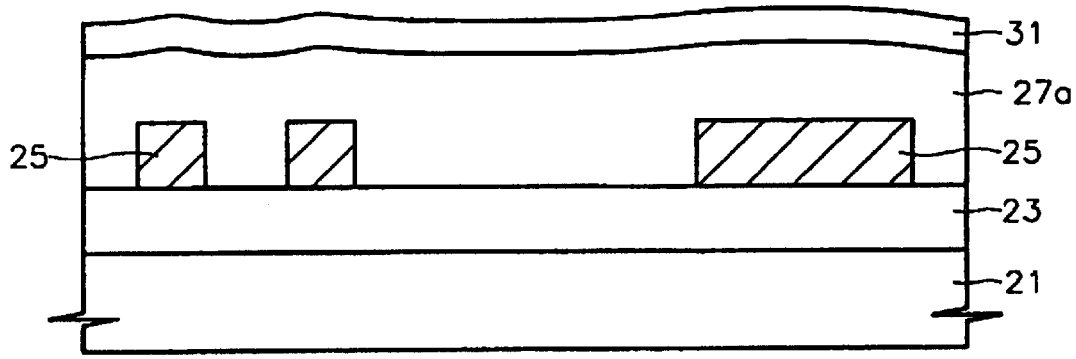

Referring to FIG. 2B, the second insulating film 29 is etched back until it is completely removed, and a third insulating film 31 is then formed on the first insulating film 27. The etching-back process is performed under a condition where the ratio of the etching selectivity of the first insulating film 27 to the second insulating film 29 is between about 3 and 0.33. As a result of such an etching-back process, a planarized first insulating film 27a is obtained. As compared to the conventional method wherein a spin scrubbing process is performed after a chemical and mechanical polishing (CMP) process, the etching-back process simplifies the process and reduces process costs. The third insulating film 31 is formed of either a single layer using any one selected among $SiO_2$, undoped silicate glass (USG), boron phosphorus silicate glass (BPSG), phosphorus silicate glass (PSG), SiOF, SiN, SiON, spin-on-glass (SOG), a flowable oxide and an insulating polymer, or a multi-layer formed by combining the single layers. At this time, the thickness of the entire third insulating film 31 is set between 10 and 100000 Å.

Among the above materials forming the third insulating film 31, $SiO_2$, undoped silicate glass (USG), boron phosphorus silicate glass (BPSG), phosphorus silicate glass (PSG), SiOF, SiN and SiON are deposited according to either a low pressure chemical vapor deposition (LPCVD) method or a plasma enhanced CVD (PECVD) method, and spin-on-glass (SOG), flowable oxide and insulating polymer are coated according to a spin coating method.

Figure 2C:
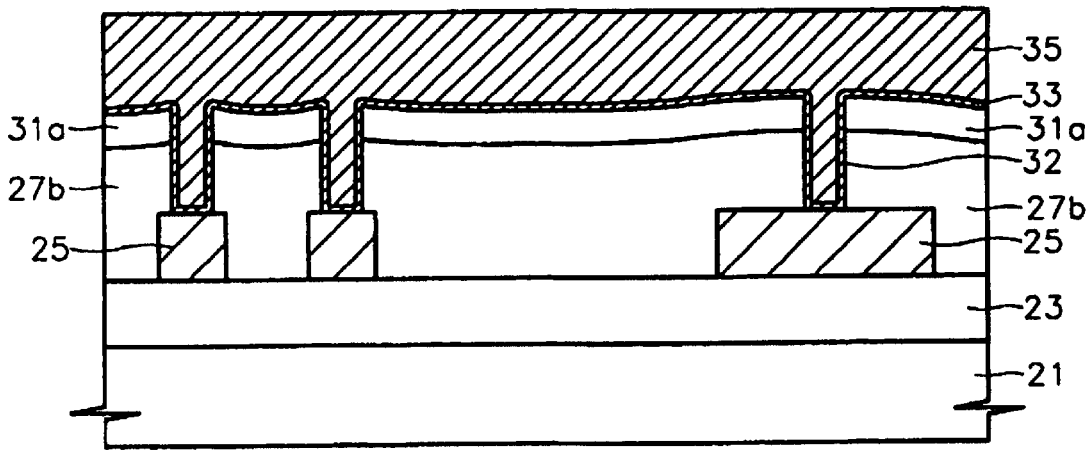

Referring to FIG. 2C, the third insulating film 31 and the first insulating film 27a are selectively etched using photolithography to expose the surface of the wiring layer 25, thereby forming the contact hole 32. Then, a barrier layer 33 is formed on the semiconductor substrate 21 on which the contact hole 32 is formed. Next, a low-resistance metal is deposited on the entire surface of the semiconductor substrate 21 on which the barrier layer 33 is formed, thereby forming the material layer 35. The barrier layer 33 can be formed of a single layer of a refractory metal, e.g., titanium (Ti), titanium nitride (TiN) or tungsten nitride (WN) or a multi layer formed by combining the single layers, in addition to a titanium nitride (TiN)/titanium (Ti) structure. The low-resistance metal for the material layer 35 includes tungsten (W), aluminum (Al) and copper (Cu). In addition, the material layer 35 can be formed of any one material selected among low-resistance metal compounds such as polysilicon, tungsten silicon, an aluminum copper compound and an aluminum copper silicon compound.

Figure 2D:
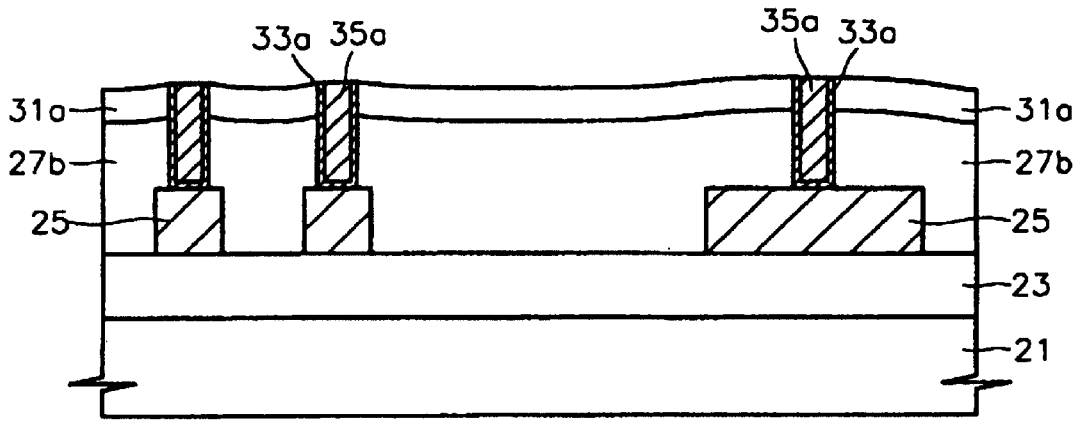

Referring to FIG. 2D, the material layer 35 and the barrier layer 33 are polished using a CMP apparatus until the surface of the third insulating film 31a is exposed. The polishing apparatus includes at least two polishing plates which can employ different slurries. The polishing process is performed by at least one polishing plate using a slurry that can polish the material layer 35 at a higher rate than the third insulating film 31a, so that the material layer 35 and the barrier layer 33 on the third insulating film 31a are selectively removed. As a result, a contact plug composed of the material layer 35a and the barrier layer 33a is formed in the contact hole 32.

Figure 2E:
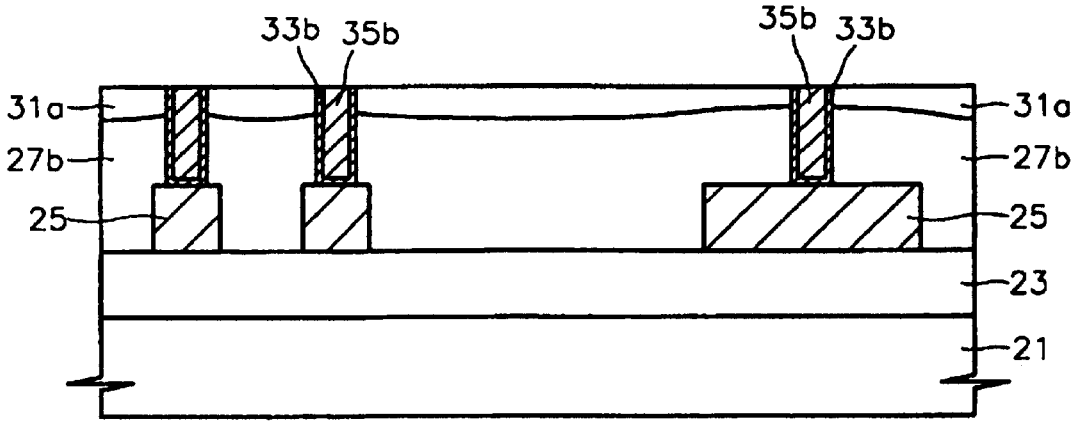

Referring to FIG. 2E, the CMP process is performed in situ to planarize the third insulating film 31a. Here, the polishing process may be performed by at least the other polishing plate of the CMP apparatus using a slurry that can polish the third insulating film 31a at a faster rate than the material layer 35a, so that a portion of the third insulating film 31a is removed.

Next, a cleaning process is performed on the semiconductor substrate 21 using DI (De-Ionized) water in order to eliminate particles generated during the polishing process. This cleaning process may be performed by a polishing plate, to which a polishing pad used only for cleansing is attached, or in a dedicated cleaning apparatus.

Figure 3A:
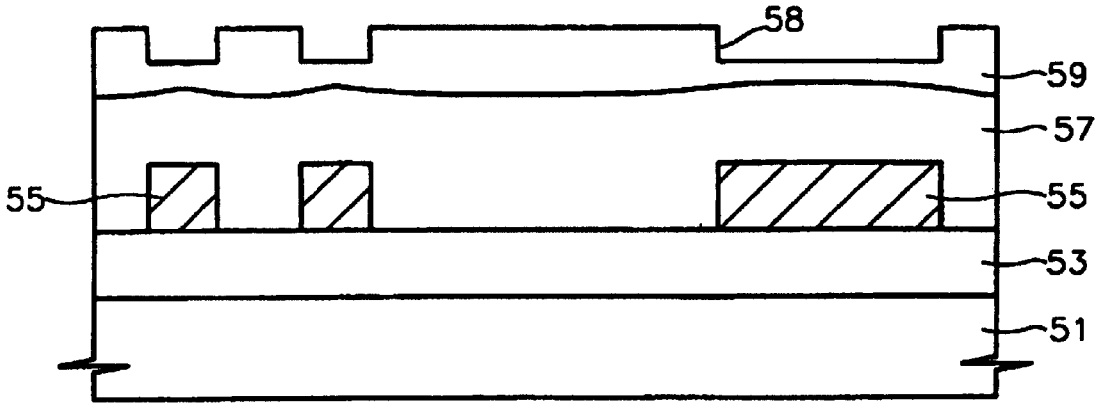
FIGS. 3A–3C are cross-sectional views of intermediate structures that illustrate a method of forming electrical interconnects according to a second embodiment of the present invention.
Figure 3B:
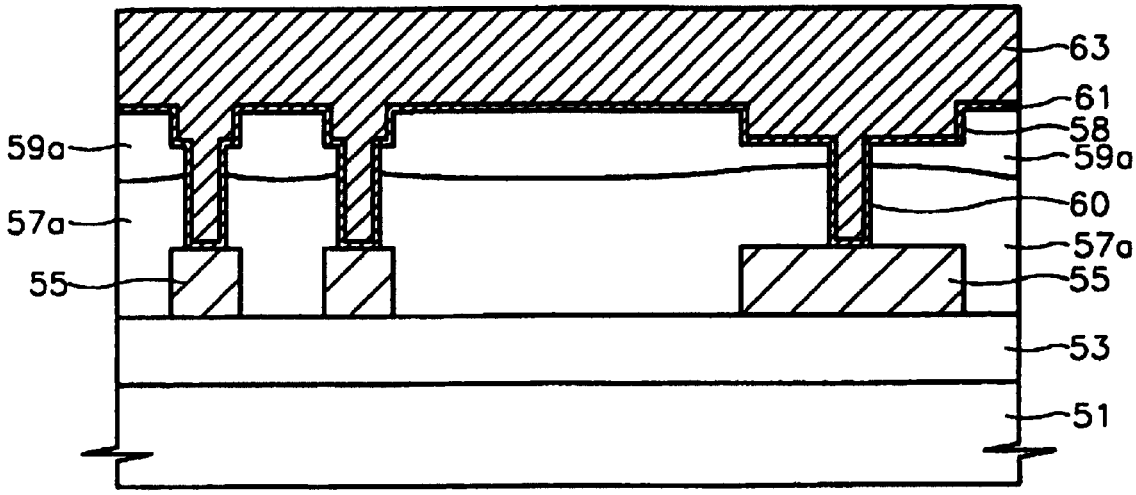
Figure 3C:
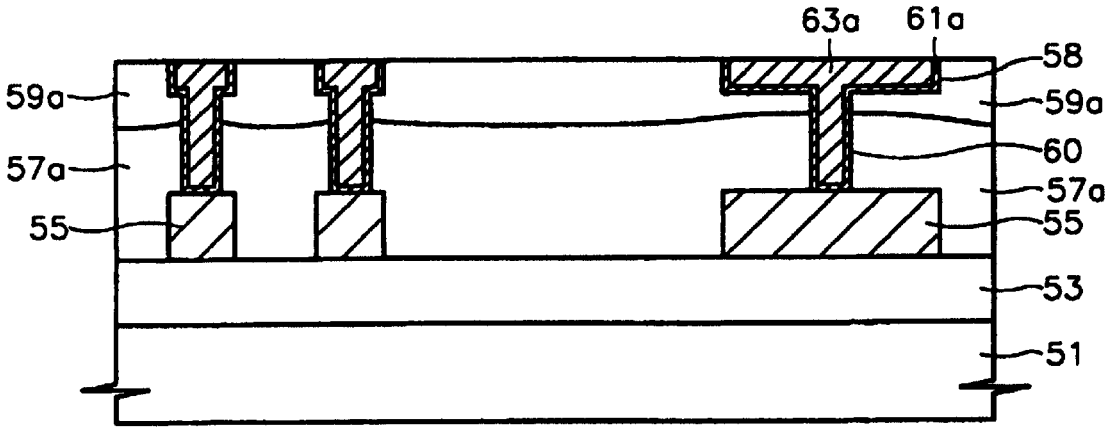

FIGS. 3A to 3C are sectional views for illustrating a second embodiment for forming a contact plug for a semiconductor device according to the present invention. Reference numeral 51 is a semiconductor substrate, reference numeral 53 is an inter-insulating layer, reference numeral 55 is a wiring layer, reference numerals 57 and 57a are first insulating films, reference numeral 58 is a trench, reference numerals 59 and 59a are third insulating films, reference numeral 60 is a contact hole, reference numerals 61 and 61a are barrier layers, and reference numerals 63 and 63a are material layers.

Referring to FIG. 3A, a conductive material is deposited on the semiconductor substrate 51 on which the inter-insulating layer 53 is formed, and then patterned to form the wiring layer 55. An insulating material is deposited on the semiconductor substrate 51 on which the wiring layer 55 is formed, thereby forming the first insulating film 57 and a second insulating film (not shown) in a sequence. Then, the second insulating film is etched back until it is completely removed. A third insulating film (which will be patterned later to be reference numeral 59) is formed on the first insulating film 57. The third insulating film above the wiring layer 55 is removed partially or completely using photolithography, thereby forming the trench 58 in the third insulating film 59. The wiring layer 55 may be formed of a metal such as aluminum (Al).

The first insulating film 57 is formed by depositing an oxide material including silicon to a thickness of between 1000 and 100000 Å using a high density plasma (HDP) method wherein deposition and etching are simultaneously performed. At this time, a step difference is generated due to the wiring layer 55. $SiO_2$, SiOF, boron phosphorus silicate glass (BPSG), etc. can be used as the oxide material including silicon. The second insulating film is formed by depositing silicon-on-glass (SOG) to a thickness of between 1000 and 100000 Å. However, any one selected among a flowable oxide, a photoresist and an insulating polymer can be used instead of SOG. Alternatively, the second insulating film can be formed by depositing any one of the above materials twice or more. At this time, a thermal treatment step is additionally performed after each of the depositing processes in order to improve the characteristics of the film material. The etching-back process is performed under a condition where the etching selectivity of the first insulating film 57 to the second insulating film is between 3 to 1 and 1 to 3. Consequently, the first insulating film 57 is planarized.

As compared to the conventional method wherein a spin scrubbing process is performed after a chemical and mechanical polishing (CMP) process, the planarizing method using the etching-back process is simple and reduces fabricating costs, as described more fully herein below. The third insulating film 59 is formed of either a single layer using any one selected among $SiO_2$, undoped silicate glass (USG), boron phosphorus silicate glass (BPSG), phosphorus silicate glass (PSG), SiOF, SiN, SiON, spin-on-glass (SOG), a flowable oxide and an insulating polymer, or a multi layer formed by combining the single layers. At this time, the thickness of the entire third insulating film 59 is set between 10 and 100000 Å.

Among the above materials forming the third insulating film 59, $SiO_2$, undoped silicate glass (USG), boron phosphorus silicate glass (BPSG), phosphorus silicate glass (PSG), SiOF, SiN or SiON may be deposited according to either a low pressure chemical vapor deposition (LPCVD) method or a plasma enhanced CVD (PECVD) method, and spin-on-glass (SOG), flowable oxide and insulating polymer may be deposited according to a spin coating method.

The trench 58 is for forming another wiring layer which is connected to the wiring layer 55. Referring to FIG. 3B, the third insulating film 59 and the first insulating film 57 are etched using photolithography to expose the surface of the wiring layer 55, thereby forming the contact hole 60. Then, the barrier layer 61 is formed on the semiconductor substrate 51 on which the contact hole 60 is formed. Next, a low-resistance metal is deposited on the entire surface of the semiconductor substrate 51 on which the barrier layer 61 is formed, thereby forming the material layer 63.

The barrier layer 61 can be formed of a single layer of a refractory metal, e.g., titanium (Ti), titanium nitride (TiN) or tungsten nitride (WN) or a multi layer formed by combining the single layers, in addition to a titanium nitride (TiN)/titanium (Ti) structure. The low-resistance metal for the material layer 63 includes tungsten (W), aluminum (Al) and copper (Cu). In addition, the material layer 63 can be formed of any one material selected among low-resistance metal compounds such as polysilicon and tungsten silicon, aluminum copper compound and aluminum copper silicon compound.

Referring to FIG. 3C, the material layer 63 and the barrier layer 61 are polished until the surface of the third insulating film 59a is exposed. A first polishing process is then performed using a slurry which is capable of polishing the material layer 63 at a faster rate than the third insulating film 59a. Consequently, the contact hole 60 and the trench 58 are filled with the material layer 63a and the barrier layer 61 a so that a contact plug is formed in the contact hole 60 and another wiring layer is formed in the trench 58. Thus, a plug and additional wiring layer can be simultaneously formed in accordance with a second embodiment of the present invention.

Then, a second polishing process is performed using another slurry which is capable of polishing the third insulating film 59a at a faster rate than the material layer 63. The first and second polishing processes may be performed using respective first and second polishing plates in a polishing apparatus. At this time, the contact plug having a material layer 63a/barrier layer 61 a structure can be formed to a certain thickness by controlling the polishing time. Next, a cleaning process is performed on the semiconductor substrate 51 using DI (De-Ionized) water in order to eliminate particles generated during the polishing process. This cleaning process may be performed by a polishing plate to which a polishing pad used only for cleansing is attached, or in a cleaning apparatus.

FIGS. 4A to 4D are sectional views for illustrating a third embodiment for forming contact plug for a semiconductor device according to the present invention. Reference numeral 71 is a semiconductor substrate, reference numeral 73 is an inter-insulating layer, reference numeral 75 is a wiring layer, reference numerals 77, 77a and 77b are insulating films, reference numeral 78 is a contact hole, reference numerals 79, 79a and 79b are barrier layers, and reference numerals 81, 81a and 81b are material layers.

Figure 4A:
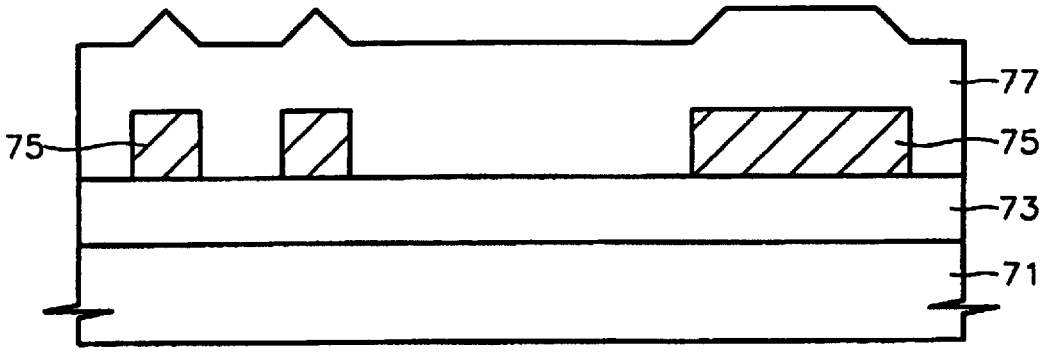
FIGS. 4A–4D are cross-sectional views of intermediate structures that illustrate a method of forming electrical interconnects according to a third embodiment of the present invention.

Referring to FIG. 4A, a conductive material is deposited on the semiconductor substrate 71 on which the inter-insulating layer 73 is formed, and then patterned to form the wiring layer 75. An insulating material is deposited on the semiconductor substrate 71 on which the wiring layer 75 is formed, thereby forming the insulating film 77. The wiring layer 75 may be formed of a metal such as aluminum (Al). The insulating film 77 may be formed by depositing an oxide material including silicon to a thickness of between 1000 and 100000 Å using a high density plasma (HDP) method wherein deposition and etching are simultaneously performed. At this time, a step difference is generated due to the wiring layer 75. $SiO_2$, SiOF, boron phosphorus silicate glass (BPSG), etc. can be used as the oxide material including silicon.

Figure 4B:
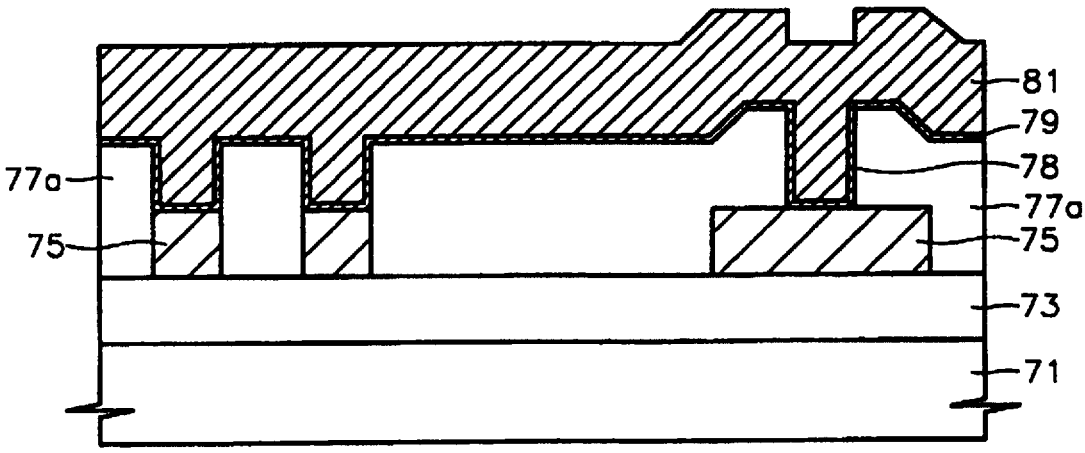

Referring to FIG. 4B, the insulating film 77 is etched using photolithography until the surface of the wiring layer 75 is exposed, thereby forming the contact hole 78. Then, the barrier layer 79 is formed on the semiconductor substrate 71 on which the contact hole 78 is formed. Next, a low-resistance metal is deposited on the entire surface of the semiconductor substrate 71 on which the barrier layer 79 is formed, thereby forming the material layer 81. The barrier layer 79 can be formed of a single layer of a refractory metal, e.g., titanium (Ti), titanium nitride (TiN) or tungsten nitride (WN) or a multi layer formed by combining the single layers, in addition to a titanium nitride (TiN)/titanium (Ti) structure. In addition, the material layer 81 can be formed of any one material selected among tungsten (W), aluminum (Al) and copper (Cu), polysilicon and a tungsten silicon compound, an aluminum copper compound, and a low-resistance metal compound such as an aluminum copper silicon compound.

Figure 4C:
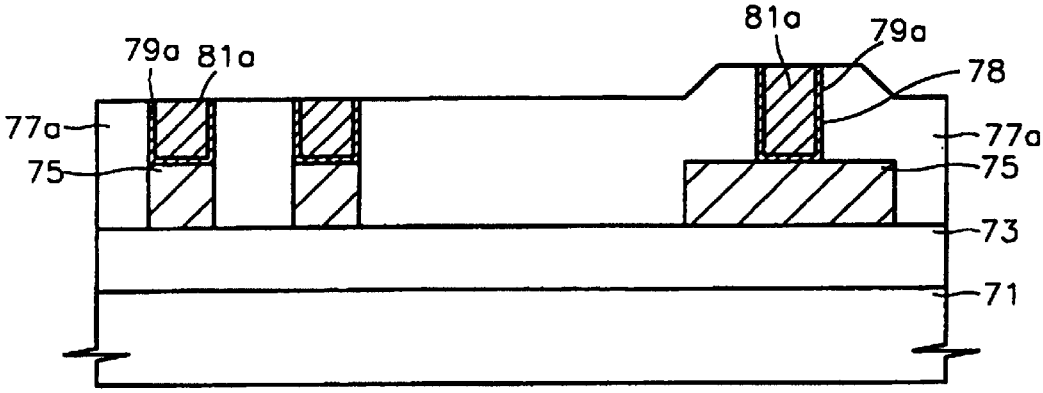
Figure 4D:
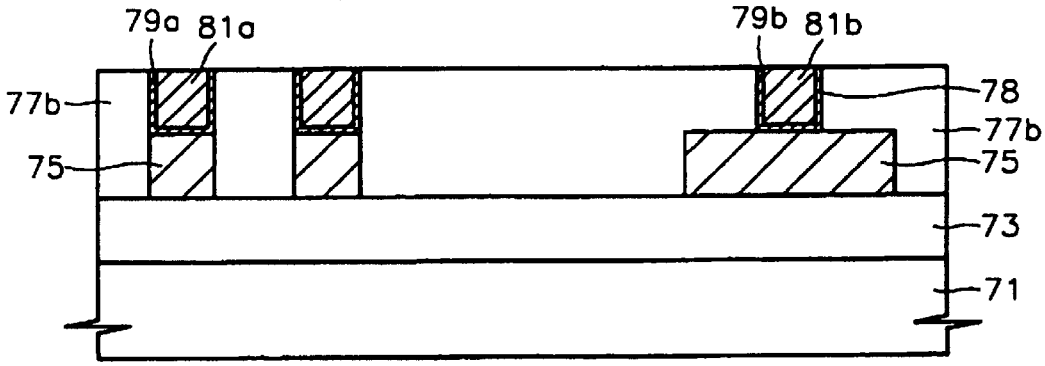

Referring to FIG. 4C, the material layer 81 and the barrier layer 79 are polished until the surface of the insulating film 77a is exposed. The polishing process is performed using a first slurry which can polish the material layer 81 faster than the insulating film 77a. This polishing step can be performed using one polishing plate of a CMP apparatus including at least two polishing plates. Referring to FIG. 4D, the polishing process is again performed using a second slurry which can polish the material layer 81 at a slower rate than the insulating film 77a. Consequently, a contact plug having the material layer 81b/barrier layer 79b structure, and the planarized insulating film 77b, are formed in the contact hole 78.

As described above, in the contact plug forming method for a semiconductor device according to the present invention, the insulating film is planarized using an etching-back method instead of a CMP process, and the material layer and the insulating film for forming a contact plug are consecutively polished using a CMP apparatus including at least two polishing plates. Therefore, the process is simplified, the planarization degree is improved, and a contact plug and another wiring layer can be simultaneously formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical interconnect, comprising the steps of:

forming a first electrically conductive layer on a semiconductor substrate;

forming a first electrically insulating layer on the first electrically conductive layer;

patterning the first electrically insulating layer to define a contact hole therein which exposes a portion of the first electrically conductive layer;

forming a barrier metal layer extending on the first electrically insulating layer and on the exposed portion of the first electrically conductive layer;

forming a second electrically conductive layer extending on the barrier metal layer and into the contact hole;

polishing the second electrically conductive layer using a first slurry that can polish the second electrically conductive layer and the first electrically insulating layer at a first rate and a second rate less than the first rate, respectively; and polishing *the first electrically insulating layer and* the second electrically conductive layer *within the contact hole* using a second slurry that can polish the second electrically conductive layer and the first electrically insulating layer at a third rate and a fourth rate greater than the third rate, respectively.

2. The method of claim 1, wherein said step of forming a first electrically insulating layer comprises depositing an oxide layer containing silicon using a plasma.

3. The method of claim 1, wherein said step of forming a barrier metal layer comprises forming a barrier metal layer containing a material selected from the group consisting of titanium, titanium nitride, tungsten nitride and combinations thereof.

4. The method of claim 1, wherein said step of forming a second electrically conductive layer comprises forming a second electrically conductive layer containing a material selected from the group consisting of tungsten, aluminum, copper and silicon.

5. The method of claim 1, wherein said polishing steps are performed in an apparatus containing first and second polishing plates with the first and second slurries, respectively.

6. The method of claim 1, wherein said step of patterning the first electrically insulating layer is preceded by the steps of:

forming a second electrically insulating layer on the first electrically insulating layer;

etching the second electrically insulating layer to expose the first electrically insulating layer; and then forming a third electrically insulating layer on the first electrically insulating layer.

7. The method of claim 6, wherein said step of etching the second electrically insulating layer comprises etching the first electrically insulating layer at a first etch rate and etching the second electrically insulating layer at a second etch rate; and wherein a ratio of the first etch rate to second etch rate is in a range between about 0.33 and 3.0.

8. The method of claim 7, wherein said step of forming a first electrically insulating layer comprises depositing an oxide layer containing silicon using a plasma.

9. The method of claim 7, wherein said step of forming a second electrically insulating layer comprises forming a second electrically insulating layer containing a material selected from the group consisting of spin-on-glass, flowable oxide, photoresist and electrically insulating polymers.

10. The method of claim 7, wherein said step of forming a third electrically insulating layer comprises forming a third electrically insulating layer containing a material selected from the group consisting of spin-on-glass, flowable oxide, electrically insulating polymers, silicon dioxide, borophosphosilicate glass, SiOF, silicon nitride and silicon oxynitride.

11. The method of claim 10, wherein said step of forming a third electrically insulating layer comprises depositing a third electrically insulating layer using low pressure or plasma enhanced chemical vapor deposition.

[12. A method of forming an electrical interconnect, comprising the steps of:

forming a first electrically conductive layer on a semiconductor substrate;

forming a first electrically insulating layer on the first electrically conductive layer;

forming a second electrically insulating layer on the first electrically insulating layer;

etching the second electrically insulating layer to expose the first electrically insulating layer;

forming a third electrically insulating layer on the first electrically insulating layer;

patterning the first and third electrically insulating layers to define a contact hole therein which exposes a portion of the first electrically conductive layer;

forming a barrier metal layer extending on the third electrically insulating layer and on the exposed portion of the first electrically conductive layer;

forming a second electrically conductive layer extending on the barrier metal layer and into the contact hole; and polishing the second electrically conductive layer and the barrier metal layer to expose the third electrically insulating layer.]

13. [The method of claim 12,] *A method of forming an electrical interconnect, comprising the steps of:*

*forming a first electrically conductive layer on a semiconductor substrate;*

*forming a first electrically insulating layer on the first electrically conductive layer;*

*forming a second electrically insulating layer on the first electrically insulating layer;*

*etching back the second electrically insulating layer until the second electrically insulating layer is removed to expose the first electrically insulating layer;*

*forming a third electrically insulating layer on the first electrically insulating layer;*

*patterning the first and third electrically insulating layers to define a contact hole therein which exposes a portion of the first electrically conductive layer;*

*forming a barrier metal layer extending on the third electrically insulating layer and on the exposed portion of the first electrically conductive layer;*

*forming a second electrically conductive layer extending on the barrier metal layer and into the contact hole; and*

*polishing the second electrically conductive layer and the barrier metal layer to expose the third electrically insulating layer;* wherein said step of polishing the second electrically conductive layer and the barrier metal layer comprises the steps of:

polishing the second electrically conductive layer and the third electrically insulating layer simultaneously at a first rate and a second rate less than the first rate, respectively, using a first slurry; and polishing the second electrically conductive layer and the third electrically insulating layer simultaneously at a third rate and a fourth rate greater than the third rate, respectively, using a second slurry.

14. The method of claim 13, wherein said step of forming a barrier metal layer comprises forming a barrier metal layer containing a material selected from the group consisting of titanium, titanium nitride, tungsten nitride and combinations thereof.

15. The method of claim 14, wherein said step of forming a second electrically conductive layer comprises forming a second electrically conductive layer containing a material selected from the group consisting of tungsten, aluminum, copper and silicon.

16. The method of claim 15, wherein said polishing steps are performed in an apparatus containing first and second polishing plates with the first and second slurries, respectively.

17. The method of claim 15, wherein said step of forming a first electrically insulating layer comprises depositing an oxide layer containing silicon using a plasma.

18. The method of claim 15, wherein said step of forming a second electrically insulating layer comprises forming a second electrically insulating layer containing a material selected from the group consisting of spin-on-glass, flowable oxide, photoresist and electrically insulating polymers.

19. The method of claim 18, wherein said step of forming a third electrically insulating layer comprises forming a third electrically insulating layer containing a material selected from the group consisting of spin-on-glass, flowable oxide, electrically insulating polymers, silicon dioxide, borophosphosilicate glass, SiOF, silicon nitride and silicon oxynitride.

20. The method of claim 19, wherein said step of forming a third electrically insulating layer comprises depositing a third electrically insulating layer using low pressure or plasma enhanced chemical vapor deposition.

[21. The method of claim 12, wherein said step of forming a third electrically insulating layer is followed by the step of forming a trench having a first width in the third electrically insulating layer; and wherein said step of patterning the first and third electrically insulating layers comprises patterning the first and third electrically insulating layers to define a contact hole having a second width less than the first width, extending between a bottom of the trench and the first electrically conductive layer.]

22. [The method of claim 21,] *A method of forming an electrical interconnect, comprising the steps of:*

*forming a first electrically conductive layer on a semiconductor substrate;*

*forming a first electrically insulating layer on the first electrically conductive layer;*

*forming a second electrically insulating layer on the first electrically insulating layer;*

*etching back the second electrically insulating layer until the second electrically insulating layer is removed to expose the first electrically insulating layer;*

*forming a third electrically insulating layer on the first electrically insulating layer;*

*patterning the first and third electrically insulating layers to define a contact hole therein which exposes a portion of the first electrically conductive layer;*

*forming a barrier metal layer extending on the third electrically insulating layer and on the exposed portion of the first electrically conductive layer;*

*forming a second electrically conductive layer extending on the barrier metal layer and into the contact hole; and*

*polishing the second electrically conductive layer and the barrier metal layer to expose the third electrically insulating layer;*

*wherein said step of forming a third electrically insulating layer is followed by the step of forming a trench having a first width in the third electrically insulating layer; and wherein said step of patterning the first and third electrically insulating layers comprises patterning the first and third electrically insulating layers to define a contact hole having a second width less than the first width, extending between a bottom of the trench and the first electrically conductive layer; and* wherein said step of polishing the second electrically conductive layer and the barrier metal layer comprises the steps of:

polishing the second electrically conductive layer and the third electrically insulating layer simultaneously at a first rate and a second rate less than the first rate, respectively, using a first slurry; and polishing the second electrically conductive layer and the third electrically insulating layer simultaneously at a third rate and a fourth rate greater than the third rate, respectively, using a second slurry.

* * * * *